(12) United States Patent
Van Den Biggelaar (10) Patent No.: US 7,679,719 B2
(45) Date of Patent: Mar. 16, 2010

(54) LITHOGRAPHIC APPARATUS HAVING A DRIVE SYSTEM WITH COORDINATE TRANSFORMATION, AND DEVICE MANUFACTURING METHOD

(75) Inventor: Petrus Marinus Christianus Maria Van Den Biggelaar, Nuenen (NL)

(73) Assignee: ASML Netherlands B.V., Veldhoven (NL)

( * ) Notice: Subject to any disclaimer, the term of this patent is extended or adjusted under 35 U.S.C. 154(b) by 342 days.

(21) Appl. No.: 11/783,108

(22) Filed: Apr. 5, 2007

(65) Prior Publication Data

US 2008/0246934 A1 Oct. 9, 2008

(51) Int. Cl.
*G03B 27/42* (2006.01)
*G03B 27/52* (2006.01)

(52) U.S. Cl. .............. 355/53; 355/72; 355/77; 318/560; 318/568.19

(58) Field of Classification Search ........ 318/163, 318/568.19, 569, 649, 560; 355/53, 72, 75, 355/77
See application file for complete search history.

(56) References Cited

U.S. PATENT DOCUMENTS 6,008,610 A * 12/1999 Yuan et al. ............ 318/592
2004/0238758 A1 * 12/2004 Antonius Theodorus Dams ............. 250/491.1
2005/0128460 A1 * 6/2005 Van Den Biggelaar et al. ................ 355/72
2005/0270507 A1 * 12/2005 Kondo ................ 355/53

* cited by examiner

*Primary Examiner*—Edward J Glick
*Assistant Examiner*—Colin Kreutzer
(74) *Attorney, Agent, or Firm*—Sterne, Kessler, Goldstein, & Fox P.L.L.C.

(57) ABSTRACT

A lithographic apparatus includes a projection system to project a patterned beam of radiation onto a substrate, which is held on a substrate support and a drive system to move the substrate support along a trajectory. In the drive system, set-point data, including set-point coordinates, are generated for moving the substrate support relative to the projection system in a first and second directions. The set-point coordinates of the first and second directions are transformed into set-point coordinates of third and fourth directions. Motion data, including motion coordinates, are generated for moving the substrate support relative to the projection system in the third and fourth directions, limiting the velocity in the third and fourth directions to a maximum velocity. The motion coordinates of the third and fourth directions are transformed into motion coordinates of the first and second directions for driving the first and second drive motors.

17 Claims, 9 Drawing Sheets

LITHOGRAPHIC APPARATUS HAVING A DRIVE SYSTEM WITH COORDINATE TRANSFORMATION, AND DEVICE MANUFACTURING METHOD

BACKGROUND

1. Field

The present invention relates to a lithographic apparatus having a drive system configured to move a substrate support along a trajectory relative to a projection system, and an associated method. The present invention also relates to a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred through a projection system onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Many industrial processes, such as lithography, involve motion of a movable part along a trajectory that is defined by precise positions at specific times, e.g., set-points. Typically, the motion is performed by a closed loop controlled servo system including a motor with an amplifier, mechanics to be actuated (e.g., a slider), a position (and/or a velocity and/or an acceleration) sensor, a feedback and feed-forward controller and a set-point generator. The motor receives the input from the controller that calculates the motor input as a function of the difference between the set-point position and the measured actual position. Feedback control ensures that the actual position will become equal to the desired commanded set-point position.

A method for determining set-point data for such a movable part can be referred to as 'trajectory planning' and the resulting set-point data can be referred to as the 'trajectory'. Typically, motion signals to be applied to one or more actuators, e.g., one or more linear or planar motors, of the movable part are determined from the set-point data of the trajectory, although not necessarily in all circumstances. The motion signals, e.g., set-point signals, are then applied to the actuator to move the movable part to the desired positions.

As an example, motion trajectories are often applied to the substrate and patterning device (e.g. mask) in a step-and-scan lithography apparatus. In a typical one of such apparatus, the substrate surface is exposed in a sequence of field scans. The exposure of each field requires that the substrate and patterning device (e.g. mask) be simultaneously scanned at precisely synchronized, substantially constant velocities. After each field exposure, a substrate stage is stepped from an initial state (i.e., a position and velocity) at the end of a field scan, to a new state (i.e., a new position and typically the same velocity) at the start of the next field scan. Similarly, a patterning device (e.g. mask) stage is also stepped from an initial state at the end of a field scan, to a new state at the start of the next field scan. To maximize processing of substrates per unit time in a lithographic apparatus, i.e., substrate throughput, it is desirable to expose a substrate in the minimum possible time.

A lithographic apparatus includes at least one substrate table or substrate support constructed to hold a substrate. The substrate support is positioned in different, mutually orthogonal directions (hereinafter referred to as x and y directions) by a positioning device that includes respective drive motors for the different, mutually orthogonal x and y directions. An x direction drive motor is used to position the substrate support in a +x or −x direction, and a y direction drive motor is used to position the substrate support in a +y or −y direction. By combining movements in +x, and +y or −y directions, or movements in −x, and +y or −y directions, the substrate support can be positioned anywhere in a (usually horizontal) plane defined by the x and y directions. By positioning the substrate support, the substrate held on the substrate support is positioned accordingly relative to the projection system for performing the stepping and scanning processes referred to above.

In "immersion" type lithographic apparatus, at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure. The liquid is captured or enclosed under a cover or hood extending between the projection system and the substrate. A gap between the cover or hood and the substrate is made impassable for the liquid by the use of air knives or other provisions for keeping the liquid between the projection system and the substrate.

In the positioning of a substrate, the x direction and y direction drive motors are controlled independently from each other by using set-point generators for generating set-point data in the x and y directions. The independent control of the x and y direction drive motors incurs that the x direction setpoint generator operates without information relating to the y direction setpoint generator, and vice versa.

Each setpoint generator uses, inter alia, a maximum velocity as a parameter to limit the maximum generated velocity in the corresponding direction. In an immersion type lithographic apparatus, the maximum velocity of the substrate may be essentially determined by the requirement to keep the immersion liquid between the projection system and the substrate, and to prevent the liquid from passing the gap between the cover or hood and the substrate. If the velocity of the cover or hood relative to the substrate would be too high, then liquid would pass the gap, whereby the substrate and its environment would become contaminated with the liquid or components thereof, and liquid would be lost inadvertently from below the cover or hood. This is an undesirable situation.

Indicating the maximum velocity of the substrate support in an immersion type lithographic apparatus as the 'maximum immersion velocity', then a problem arises if, for a particular movement, each of the x direction and y direction setpoint generators have their maximum generated velocity set to the maximum immersion velocity. In case of generating a combination of a velocity equal to the maximum immersion velocity in either the x direction or the y direction, and an absolute velocity higher than zero in the other direction, (an absolute value of) a resultant velocity, i.e. a sum velocity vector of the x and y velocities, will in fact exceed (an absolute value of) the maximum immersion velocity. In a worst case scenario, if both in the x direction and in the y direction a velocity is generated to have a value equal to the maximum immersion velocity by the respective setpoint generators, the sum velocity vector will be at 45° relative to the x or y direction, and has an absolute value of square root of two (approximately 1.4) times the maximum immersion velocity. Thus, in fact the maximum immersion velocity may be exceeded considerably, with the adverse consequences described above.

SUMMARY

It is desirable to control the velocity of the substrate support such that the maximum immersion velocity will not be exceeded in any direction.

According to an embodiment of the invention, there is provided a lithographic apparatus including: a substrate support constructed to hold a substrate; a projection system configured to project a patterned radiation beam onto a target portion of the substrate; and a drive system configured to move the substrate support along a trajectory relative to the projection system, the drive system including: at least one first drive motor configured to move the substrate support in a first direction; at least one second drive motor configured to move the substrate support in a second direction; a first trajectory planner configured to generate set-point data, including set-point coordinates, for the at least one first drive motor to move in the first direction; a second trajectory planner configured to generate set-point data, including set-point coordinates, for the at least one second drive motor to move in the second direction; a first coordinate transformer configured to transform the set-point coordinates of the first direction and the second direction determined by the first and second trajectory planner, respectively, into set-point coordinates of a third direction and a fourth direction; a first set-point generator configured to generate motion data, including motion coordinates, for the at least one first drive motor to move in the third direction, limiting the velocity in the third direction to a first maximum velocity; a second set-point generator configured to generate motion data, including motion coordinates, for the at least one second drive motor to move in the fourth direction, limiting the velocity in the fourth direction to a second maximum velocity; and a second coordinate transformer configured to transform the motion coordinates of the third direction and the fourth direction determined by the first set-point generator and the second set-point generator, respectively, into motion coordinates of the first direction and the second direction, respectively, for driving the first and second drive motors, respectively.

According to an embodiment of the invention, the first coordinate transformer performs a transformation determined by:

$$p1 = \frac{1}{2} * sqrt(2) * x1 + \frac{1}{2} * sqrt(2) * y1$$

$$q1 = -\frac{1}{2} * sqrt(2) * x1 + \frac{1}{2} * sqrt(2) * y1$$

where:
 x1 set-point coordinate in first direction,
 y1 set-point coordinate in second direction,
 p1 set-point coordinate in third direction,
 q1 set-point coordinate in fourth direction.

According to an embodiment of the invention, the second coordinate transformer performs a transformation determined by:

$$x2 = \frac{1}{2} * sqrt(2) * p2 - \frac{1}{2} * sqrt(2) * q2$$

$$y2 = \frac{1}{2} * sqrt(2) * p2 + \frac{1}{2} * sqrt(2) * q2$$

where:
 x2 motion coordinate in first direction,
 y2 motion coordinate in second direction,
 p2 motion coordinate in third direction,
 q2 motion coordinate in fourth direction.

In a further embodiment of the invention, there is provided a method for moving a substrate support relative to a projection system in a lithographic apparatus, the method including: providing a substrate support constructed to hold a substrate; providing a projection system configured to project a patterned radiation beam onto a target portion of the substrate; providing a drive system configured to move the substrate support along a trajectory, the drive system including at least one drive motor configured to move the substrate support in a first direction, and at least one drive motor configured to move the substrate support in a second direction; generating set-point data, including set-point coordinates, for moving the substrate support relative to the projection system in the first direction; generating set-point data, including set-point coordinates, for moving the substrate support relative to the projection system in the second direction; transforming the set-point coordinates of the first direction and the second direction, respectively, into set-point coordinates of a third direction and a fourth direction; generating motion data, including motion coordinates, for moving the substrate support relative to the projection system in the third direction, limiting the velocity in the third direction to a first maximum velocity; generating motion data, including motion coordinates, for moving the substrate support relative to the projection system in the fourth direction, limiting the velocity in the fourth direction to a second maximum velocity; and transforming the motion coordinates of the third direction and the fourth direction, respectively, into motion coordinates of the first direction and the second direction, respectively, for driving the first and second drive motors, respectively.

In a further embodiment of the invention, there is provided a lithographic apparatus having a projection system to project a pattern from a patterning device onto a substrate held on a substrate support, the lithographic apparatus including a drive system configured to move the substrate support along a trajectory relative to the projection system, the drive system including: at least one first drive motor configured to move the substrate support in a first direction; at least one second drive motor configured to move the substrate support in a second direction; a first trajectory planner configured to generate set-point data, including set-point coordinates, for the at least one first drive motor to move in the first direction; a second trajectory planner configured to generate set-point data, including set-point coordinates, for the at least one second drive motor to move in the second direction; a first coordinate transformer configured to transform the set-point coordinates of the first direction and the second direction determined by the first and second trajectory planner, respectively, into set-point coordinates of a third direction and a fourth direction; a first set-point generator configured to generate motion data, including motion coordinates, for the at least one first drive motor to move in the third direction, limiting the velocity in the third direction to a first maximum velocity; a second set-point generator configured to generate motion data, including motion coordinates, for the at least one second drive motor to move in the fourth direction, limiting the velocity in the fourth direction to a second maximum velocity; and a second coordinate transformer configured to transform the motion coordinates of the third direction and the fourth direction determined by the first set-point generator and the second set-point generator, respectively, into motion coordinates of the first direction and the second direction, respectively, for driving the first and second drive motors, respectively.

In a further embodiment of the invention, there is provided a device manufacturing method including projecting a patterned beam of radiation onto a substrate, the method including: providing a substrate support constructed to hold the substrate; providing a drive system configured to move the substrate support along a trajectory, the drive system including at least one drive motor configured to move the substrate support in a first direction, and at least one drive motor configured to move the substrate support in a second direction; generating set-point data, including set-point coordinates, for moving the substrate support relative to the projection system in the first direction; generating set-point data, including set-point coordinates, for moving the substrate support relative to the projection system in the second direction; transforming the set-point coordinates of the first direction and the second direction, respectively, into set-point coordinates of a third direction and a fourth direction; generating motion data, including motion coordinates, for moving the substrate support relative to the projection system in the third direction, limiting the velocity in the third direction to a first maximum velocity; generating motion data, including motion coordinates, for moving the substrate support relative to the projection system in the fourth direction, limiting the velocity in the fourth direction to a second maximum velocity; and transforming the motion coordinates of the third direction and the fourth direction, respectively, into motion coordinates of the first direction and the second direction, respectively, for driving the first and second drive motors, respectively.

In a further embodiment of the invention, there is provided a computer program product containing one or more sequences of machine-readable instructions adapted to make a computer system perform the steps of: generating set-point data, including set-point coordinates, for moving a substrate support of a lithographic apparatus in a first direction; generating set-point data, including set-point coordinates, for moving the substrate support in a second direction; transforming the set-point coordinates of the first direction and the second direction, respectively, into set-point coordinates of a third direction and a fourth direction; generating motion data, including motion coordinates, for moving the substrate support in the third direction, limiting the velocity in the third direction to a first maximum velocity; generating motion data, including motion coordinates, for moving the substrate support in the fourth direction, limiting the velocity in the fourth direction to a second maximum velocity; and transforming the motion coordinates of the third direction and the fourth direction, respectively, into motion coordinates of the first direction and the second direction, respectively.

In an embodiment of the invention, there is provided a device manufacturing method including projecting a patterned beam of radiation onto a substrate with a projection system, the substrate held by a substrate support; and moving the substrate support along a trajectory, the moving including generating set-point data, including set-point coordinates, for moving the substrate support relative to the projection system in a first direction; generating set-point data, including set-point coordinates, for moving the substrate support relative to the projection system in a second direction; transforming the set-point coordinates of the first direction and the second direction, respectively, into set-point coordinates of a third direction and a fourth direction; generating motion data, including motion coordinates, for moving the substrate support relative to the projection system in the third direction, limiting the velocity in the third direction to a first maximum velocity; generating motion data, including motion coordinates, for moving the substrate support relative to the projection system in the fourth direction, limiting the velocity in the fourth direction to a second maximum velocity; and transforming the motion coordinates of the third direction and the fourth direction, respectively, into motion coordinates of the first direction and the second direction, respectively, for driving the first and second drive motors, respectively.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
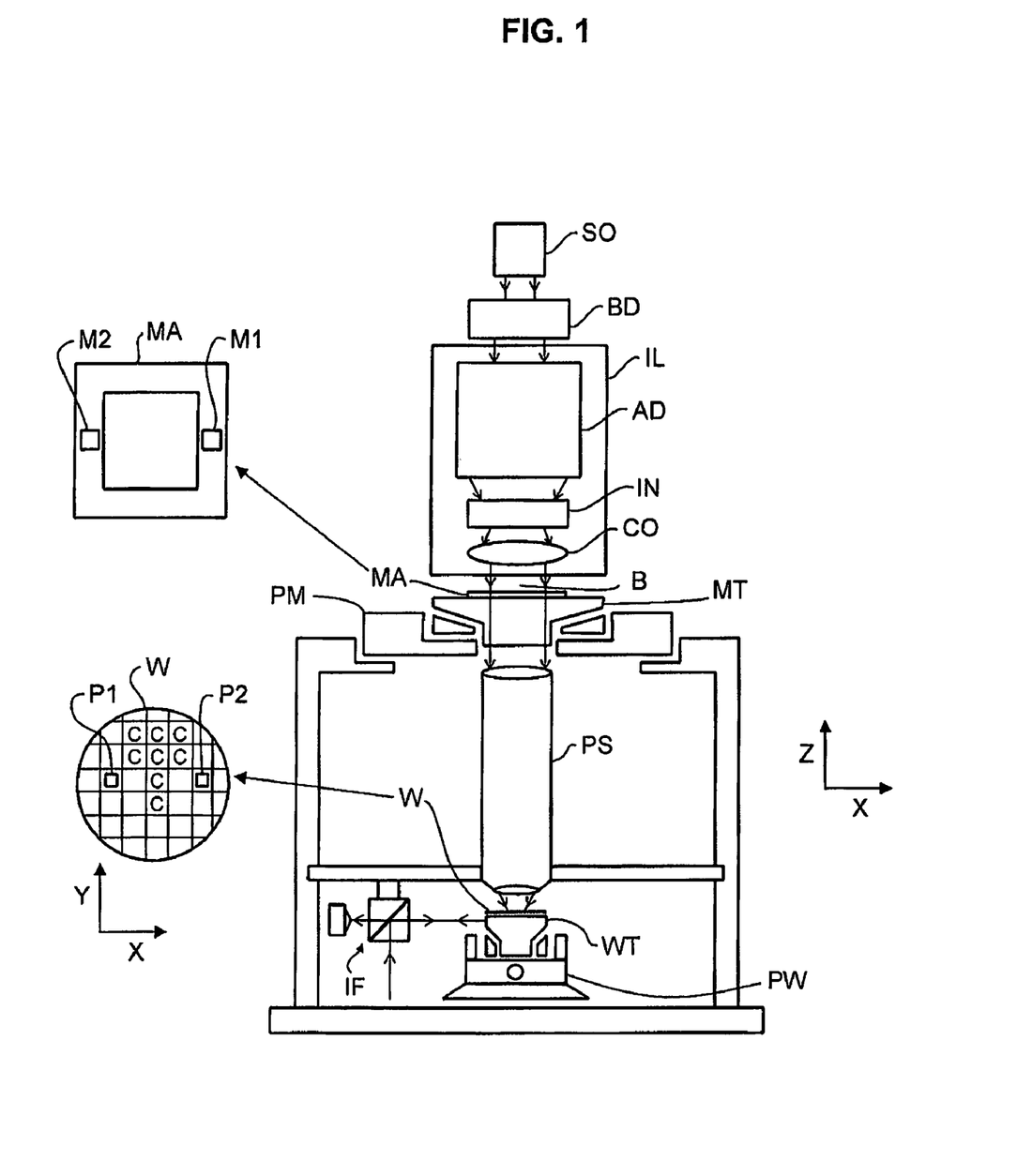
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure or pattern support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the support structure or pattern support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the support structure (e.g. mask table) MT or "pattern support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT or "pattern support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the support structure (e.g. mask table) MT or "pattern support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT or "pattern support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Next, trajectory planning of a movable part, such as a substrate table and/or support structure (e.g. mask table), will be described. As used herein, a movable part is any part (including a subsystem or a device) of an apparatus (such as a lithographic apparatus) that is designed to perform a motion relative to any or all other parts of the apparatus in at least two degrees of freedom. At least these degrees of freedom are under active control, i.e., a 'controlled motion', which, for example, implies that there is a sensing device from which the position of the movable part along at least one of the degrees of freedom can be obtained with sufficient accuracy, and an actuator capable of changing the position of the movable part in at least this degree of freedom to a desired position, typically given by a motion signal. As used herein, position includes translational position, and accordingly changing the position includes translation.

Figure 2:
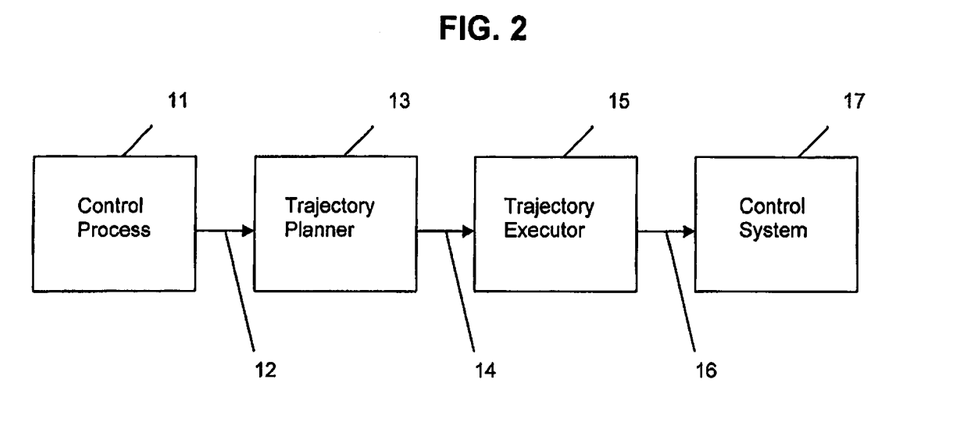
FIG. 2 is a block diagram of a motion control system of a lithographic apparatus.

Referring to FIG. 2, in a trajectory planning for a movable part, such as a trajectory for a substrate and/or mask table, of a lithographic apparatus, a control process 11 is configured to provide initial control data 12 regarding the movable part to a trajectory planner 13. Initial control data includes a priori information, used during trajectory planning, about the properties of the trajectory for the movable part. Typical examples of such control data are: (1) begin or initial position and end position of the movable part; (2) starting time and/or stopping time of a movement of the movable part; (3) any intermediate position of the movable part that should be obtained at a specific time; and/or (4) a velocity of the movable part that must be obtained at a specific time and maintained between two specific positions of the movable part.

In a typical scanning example, the initial control data 12 includes the starting point of a scan, the distances and velocities of the scan, and stopping points of the scan.

The trajectory planner 13 is adapted to calculate the desired trajectory for the movable part in accordance with the control data 12. This design results in the generation by the trajectory planner 13 of a set of motion data 14, typically set-point data as a function of time. Motion data 14 can be viewed as a state signal set that defines a trajectory for the movable part. Set-point data 14 typically includes the definition of quantized time intervals of acceleration of the movable part during the trajectory, as well as the acceleration value(s) during these intervals. Set-point data 14 may also or alternatively include the position and velocity at the start of each acceleration interval. Set-point data 14 may also or alternatively include specific positions of the movable part at a specific time, in which the position is expressed in the form of a set of coordinates, including a coordinate for each degree of freedom under active control. The trajectory planner 13 typically defines motion of the movable part in a single degree of freedom.

In an embodiment, the trajectory planner 13 is configured to design or determine the trajectory in an off-line process. Thus, in the case of a lithographic apparatus, motion data 14 is generated prior to commencement of, for example, substrate table or support structure (e.g. mask table) scanning operations.

The motion data 14 is then used by a trajectory executor 15. The trajectory executor 15 uses the motion data to produce motion signals 16. Set-point signals 16, a form of motion signals, include a series of real-time commands to the control system of the movable part and define positions and accelerations of the movable part. These set-point signals generally correspond to the set-point data 14. The motion signals 16 may include $1^{st}$, $2^{nd}$, $3^{rd}$, $4^{th}$, etc., derivatives of the set-point signal. As with the set-point data, the set-point signals also can be expressed in the form of a set of coordinates, including a coordinate for each degree of freedom in which the actuator is capable of changing the position of the movable part.

The motion signals 16 are then provided to a control system 17. The control system 17 represents the electromechanical control mechanism used to move the movable part of the lithographic apparatus (e.g. the substrate and/or mask table) according to the motion signals 16. The control system determines the control signals to be applied to the actuator of the movable part. The determination of the control signal may include: (1) a feed-forward part based on a pre-specified relation between the motion signal and the control signal; and/or (2) a feedback part based on a measured value of a characteristic (e.g., a position or velocity) of the movable part in relation to a current desired value of that characteristic as specified by the motion signal.

Motion data 14 and motion signals 16 can be considered as being synonymous with trajectory profiles, since in the case of set-point data and set-point signals they merely reflect quantized values of the trajectory profiles. Also, in an embodiment, motion data 14 may be applied directly to the control system without conversion into motion signals 16.

The trajectory planner 13 and/or trajectory executor 15 can be implemented as a computer program product that is processed by a computer or any other hardware. However, the trajectory planner 13 and/or trajectory executor 15 can also be implemented in hardware, firmware or any combination of hardware, firmware and/or software. The hardware, firmware, software or combination thereof for the trajectory planner 13 and/or the trajectory executor 15 may be generically referred to as a trajectory generator. For example, the trajectory planner 13 and/or the trajectory executor 15 may be implemented in whole or in art in multiple pieces of hardware or in a single piece of hardware, to control one or more degrees of freedom of a movable part. Further, the hardware may include the relevant data for the trajectory planner 13 and/or the trajectory executor 15 and/or include one or more interfaces to sources of relevant data, e.g., a sensing device and/or a database. The relevant data may be separate from or integrated into a trajectory algorithm of the trajectory planner 13 and/or of the trajectory executor 15, and may be alterable.

In an implementation, a lithographic apparatus includes: (1) a computer having a trajectory planning and/or execution algorithm (e.g., trajectory planner 13 and/or trajectory executor 15) and relevant data, (2) an interface configured to obtain any other relevant data for the trajectory planning and/or execution algorithm from a sensing device and/or any other related devices, (3) an interface configured to transmit the control signal determined by the trajectory planning and/or execution algorithm, and (4) a converting device configured to convert the received control signal to one or more physical quantities related to an actuator's capability of changing the position of a movable part.

A trajectory to be performed may include an exposure scan in a single linear degree of freedom of the object table while keeping all other degrees of freedom at a substantially constant position coordinate. The scan may be specified as follows: (1) the exposure starts at a given position and time; (2) the exposure ends at a given position; and (3) after exposure, the object table is brought to standstill as quickly as possible.

The actuator for the object table includes one or more electro-magnetical actuators, such as linear motors, Lorentz motors, planar motors, piezoeletric actuators, etc., capable of exerting forces on the object table. The sensing device for the object table to monitor the position of the object table may include a laser interferometer system and one or more cooperating mirror surfaces on the object table. The position of the object table may be determined using the sensing device.

A planned, calculated trajectory may have the property that bounds on various profiles (jerk profile, acceleration profile, velocity profile, position profile) are provided: first the snap (derivative of jerk) has a maximum value, then the jerk, then the acceleration, and then the velocity. Incidentally, this will not be the case for all relevant trajectories.

In calculations for a trajectory, the motion data 14 (e.g., set-point data) may be extracted from the position, velocity, acceleration, jerk and/or snap profiles. The motion data 14 is then converted to appropriate motion signals 16 provided to the control system 17 of the movable part.

Figure 9:
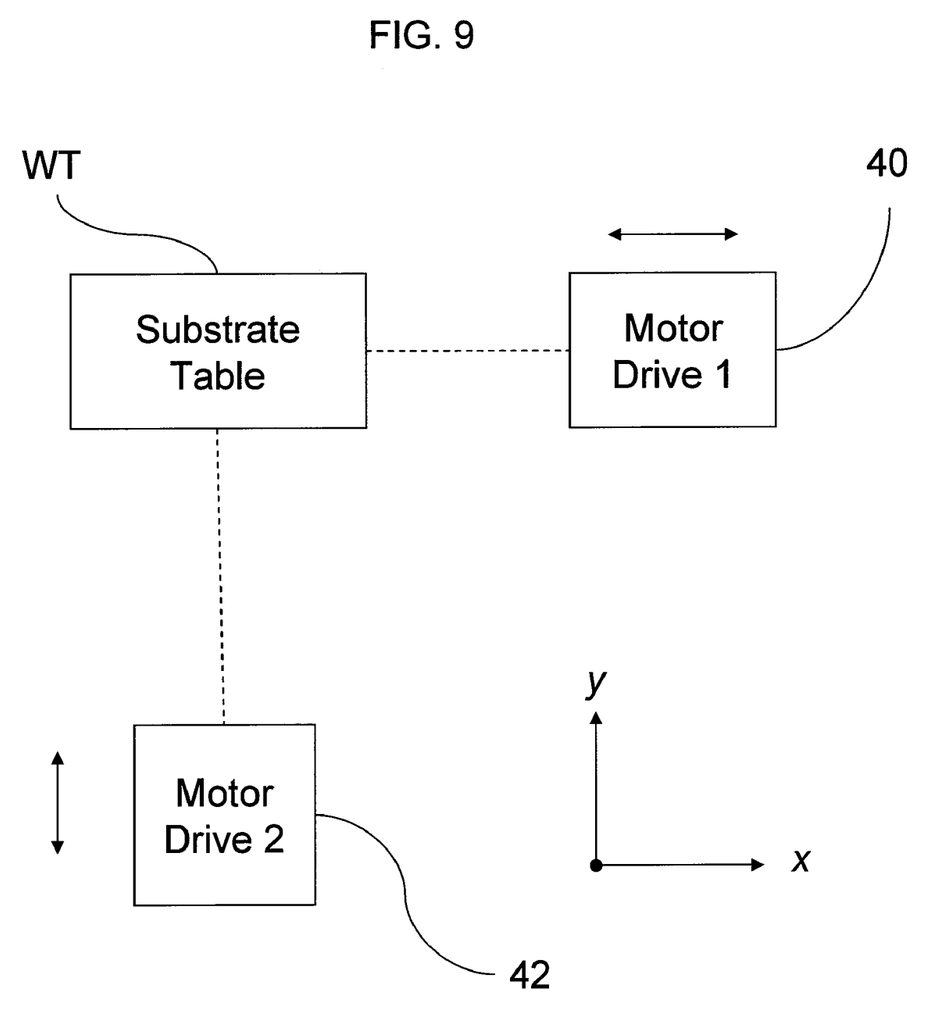
FIG. 9 shows an two motor driven exemplary system.

FIG. 9 schematically depicts a substrate table WT coupled to a first drive motor 40 and a second drive motor 42. The first drive motor 40 travels linearly in a first direction (e.g., X-direction). The second drive motor 42 travels linearly in a second direction (e.g., Y-direction). Each of the first and second drive motors 40, 42 can individually move the substrate table WT in a first or a second direction. The first and second drive motors 40, 42 can move in concert, allowing the substrate table WT to travel in any direction in the X,Y plane. The substrate table WT can thus travel in, but is not limited to, a third and a fourth direction.

Figure 3:
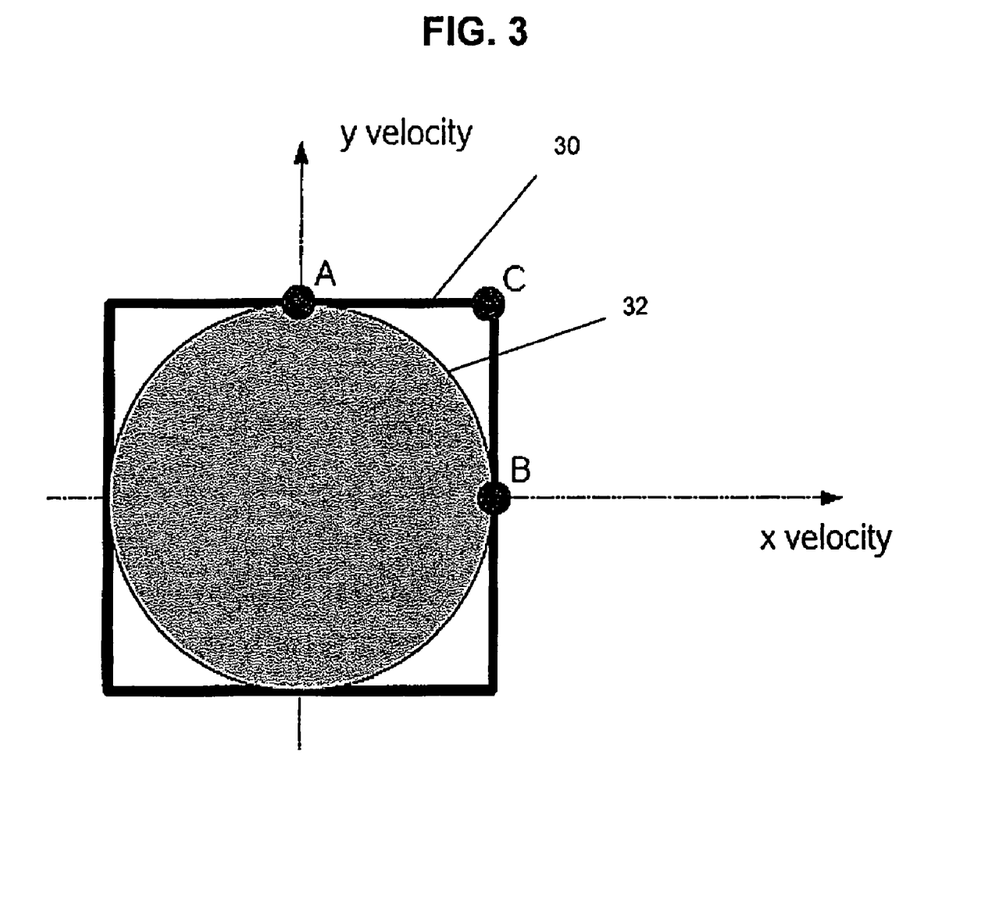
FIG. 3 illustrates a velocity vector diagram in x and y directions.

FIG. 3 illustrates a velocity vector plane, e.g., for velocities of a substrate table or substrate support moved along a trajectory by a drive system, which drive system includes at least one drive motor configured to move the substrate support in a first direction, and at least one drive motor configured to move the substrate support in a second direction. Here, a coordinate system is assumed where an x axis indicates velocities in the first direction or x direction ('x velocities'), and a y axis indicates velocities in the second direction or y direction ('y velocities'). A square 30 delimits a field of sum velocity vectors that can be obtained by setting (an absolute value of) an x velocity less than, or equal to a maximum x velocity in a +x and a −x direction, and setting (an absolute value of) a y velocity less than, or equal to a maximum y velocity in a +y and a −y direction. For example, in a point A, an x velocity is equal to zero, whereas a y velocity is equal to the maximum y velocity in the +y direction. As another example, in a point B, an x velocity is equal to the maximum x velocity in the +x direction, whereas the y velocity is equal to zero.

Any point on a circle 32 indicates a length (absolute value) of a sum velocity vector being a sum of an x velocity and a y velocity, where (the absolute value of) the sum velocity vector is less than, or equal to the maximum x velocity and the maximum y velocity.

Now, it will be appreciated that for a sum velocity vector being a sum of an x velocity and an y velocity, where for example one of the x velocity and the y velocity is equal to the maximum x or y velocity, respectively, and the other one of the x velocity and the y velocity is different from zero, a sum velocity vector with a length (absolute value) outside the circle 32 (on the square 30) will result. Also, other combinations of x and y velocities leading to a sum velocity vector outside the circle 32, may be possible. In other words, in such situations (the absolute value of) the sum velocity vector may in fact exceed (the absolute value of) the maximum x velocity or the maximum y velocity. For example, in a point C, an x velocity and a y velocity both are equal to the maximum x velocity and the maximum y velocity, respectively, and the length (absolute value) of the sum velocity vector exceeds the maximum x and y velocity with a factor of the square root of two (approx. 1.4).

In case of an immersion type lithographic apparatus, where the maximum x velocity and the maximum y velocity are equal to the maximum immersion velocity, and (the absolute value of) the sum velocity vector is higher than the maximum immersion velocity, this may cause a problem of keeping an immersion liquid on a substrate within its enclosure.

Figure 4:
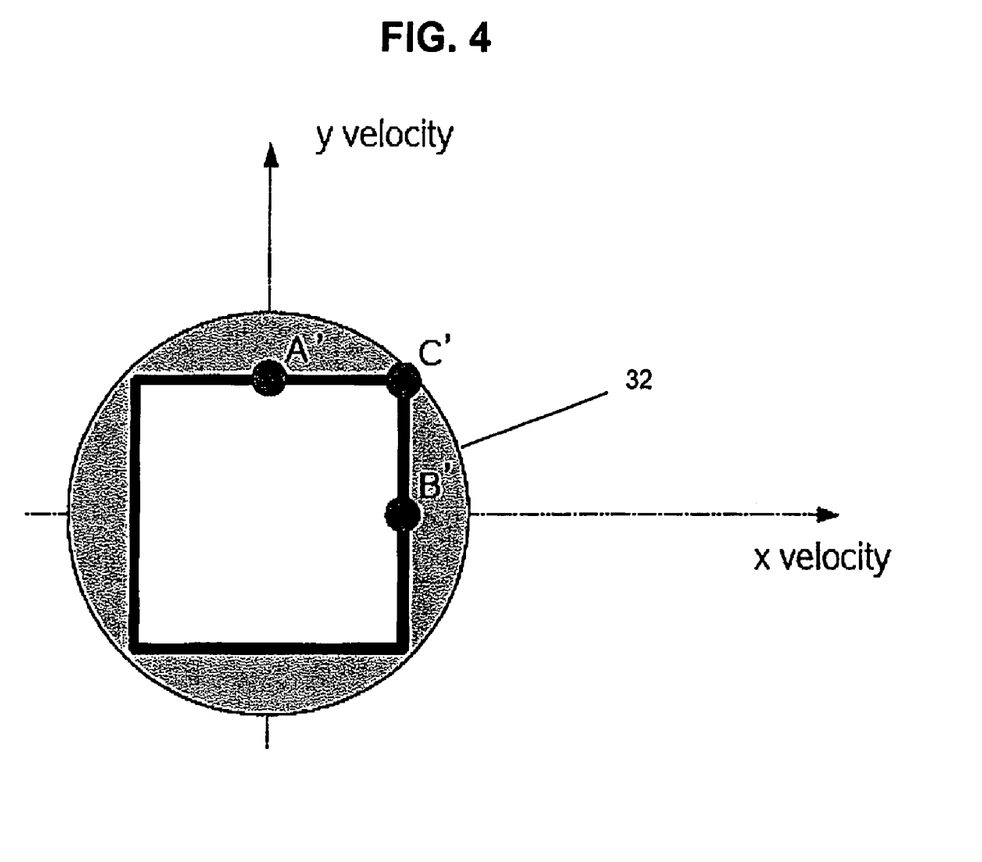
FIG. 4 illustrates a further velocity vector diagram in x and y directions.

As illustrated in FIG. 4, a sum velocity vector being a sum of an x velocity and a y velocity, and having a length (absolute value) not exceeding any point on the circle 32 can be obtained by limiting the x velocity to [0.5*(square root of two)*(maximum x velocity)], as indicated by point B', and limiting the y velocity to [0.5*(square root of two)*(maximum y velocity)], as indicated by point A', so that in the event that both the x velocity and the y velocity reach their limits, (the absolute value of) the sum velocity vector will not exceed a maximum velocity, as indicated by point C'. Thus, in case of an immersion type lithographic apparatus, where the maximum x velocity and the maximum y velocity are substantially equal to the maximum immersion velocity, thanks to the above limitations of the x velocity and the y velocity, the maximum immersion velocity may not be exceeded.

However, as will be appreciated in FIG. 4, for x velocities being less than its limit [0.5*(square root of two)*(maximum x velocity)], the limit [0.5*(square root of two)*(maximum y velocity)] of the y velocity could be exceeded without the sum velocity vector exceeding the maximum x velocity or the maximum y velocity, each of which are assumed to be substantially equal to the maximum immersion velocity. Similarly, for y velocities being less than its limit [0.5*(square root of two)*(maximum y velocity)], the limit [0.5*(square root of two)*(maximum x velocity)] of the x velocity could be exceeded without the sum velocity vector exceeding the maximum x velocity or maximum y velocity, or the maximum immersion velocity. This may lower a throughput of a lithographic apparatus, since most of the time movements of the substrate table are made in the +y or −y direction, the velocity in the x direction being equal to zero at that time, although in fact the y velocity could be chosen at the maximum y velocity in such circumstances. However, since in practice the x velocity is calculated independently from the y velocity to avoid excessive (complex) calculation time in the corresponding control system, such as the control system 17 of FIG. 2, this is not implemented.

Figure 5:
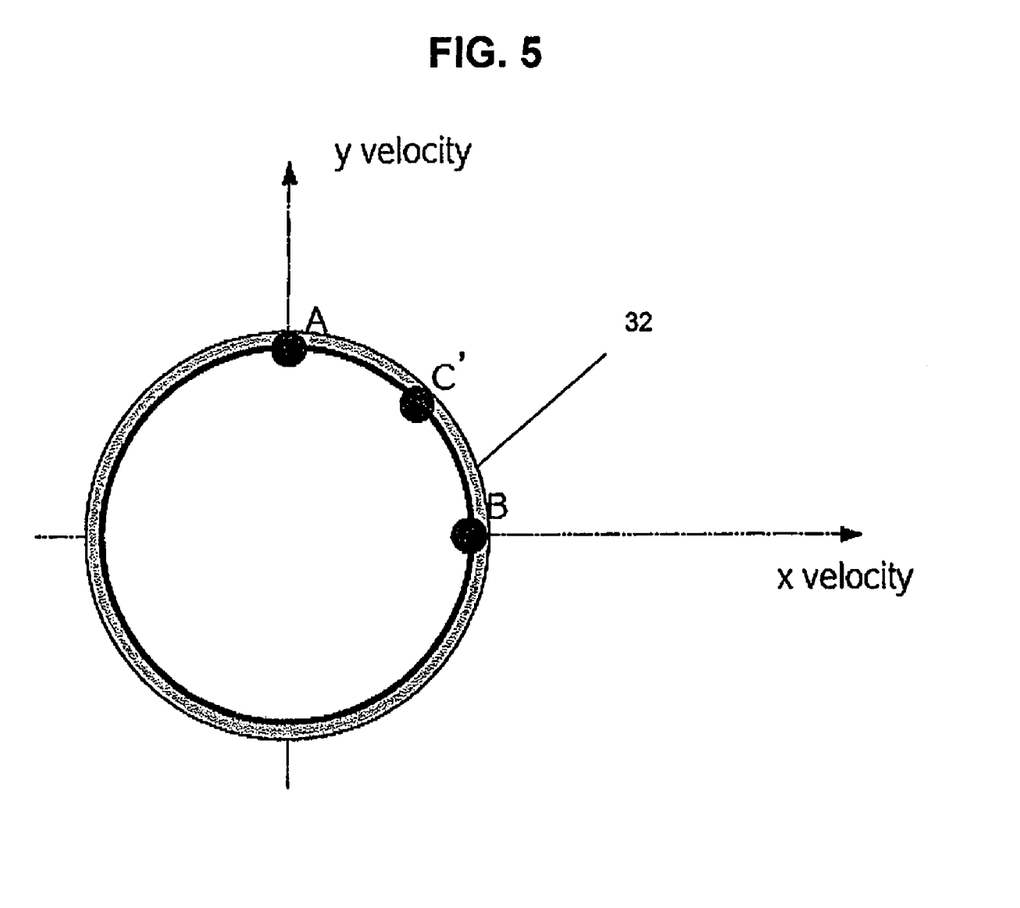
FIG. 5 illustrates a still further velocity vector diagram in x and y directions.

As illustrated in FIG. 5, a sum velocity vector being a sum of an x velocity and a y velocity, and having a length (absolute value) not exceeding any point on the circle 32 can be obtained by choosing the x velocity and the y velocity such that the length (absolute value) of the sum velocity vector will not exceed a maximum velocity, as indicated by any of points A, B or C'. In other words, the maximum x velocity depends from the actual y velocity, and vice versa. As indicated above, however, in practice the x velocity is calculated independently from the y velocity to avoid excessive calculation time in a control system, such as the control system of FIG. 2, although calculating an x velocity and a y velocity in accordance with the indication in FIG. 5 could provide a high throughput of a lithographic apparatus.

Figure 6:
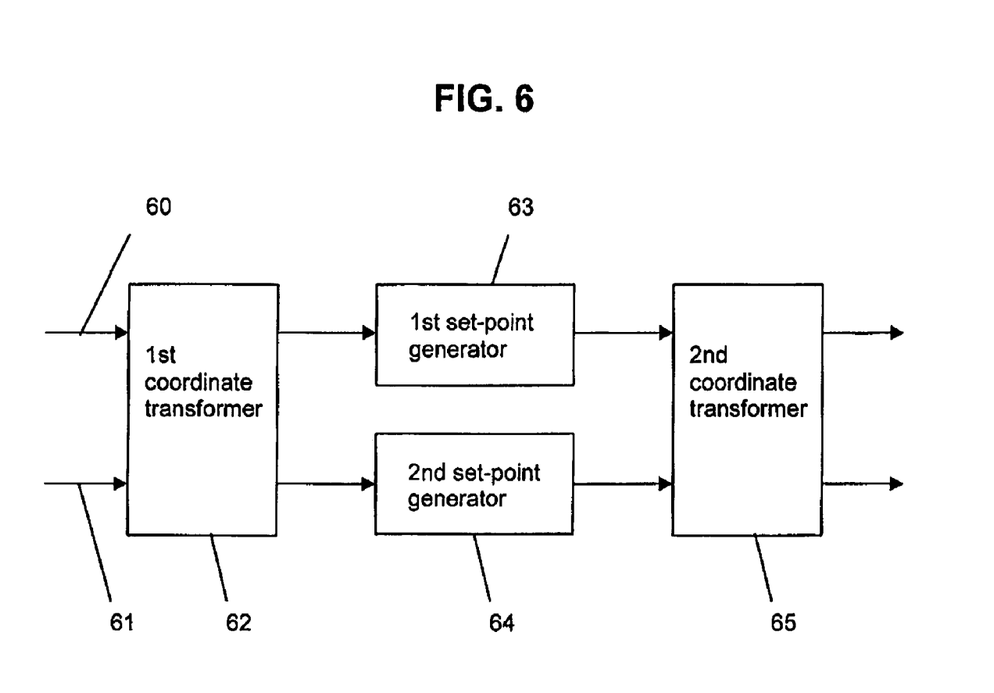
FIG. 6 depicts a block diagram of a set-point generating part of a motion control system according to an embodiment of the present invention.

FIG. 6 illustrates a set-point generating part of a motion control system of a lithographic apparatus according to an embodiment of the present invention. In such part of a motion control system, a first trajectory planner (not shown) is configured to generate set-point data 60, including set-point coordinates, for a first drive motor (being part of the second positioning device PW of FIG. 1) to move a substrate table WT in the x direction. A second trajectory planner (not shown) is configured to generate set-point data 61, including set-point coordinates, for a second drive motor (being part of the second positioning device PW of FIG. 1) to move the substrate table WT in the y direction. A first coordinate transformer 62 is configured to transform the set-point coordinates of the x direction and the y direction determined by the first trajectory planner 60 and the second trajectory planner 61, respectively, into set-point coordinates of a p direction and a q direction.

Here, in addition to the x, y coordinate system, a second coordinate system p, q is assumed, where the p direction may be at an angle $\alpha$ to the x direction, where $0<\alpha<90°$. In the following, it is assumed that $\alpha=45°$. The q direction may be at an angle $\beta$ to the y direction, where $0<\beta<90°$. In the following, it is assumed that $\beta=45°$. Thus, where the x, y coordinate system is an orthogonal coordinate system, the p, q coordinate system may also be an orthogonal coordinate system. It is to be noted, however, that various other coordinate systems may be chosen.

The first coordinate transformer 62 is configured to perform a transformation determined by the formulas [1] and [2]:

$$p1=½*\text{sqrt}(2)*x1+½*\text{sqrt}(2)*y1 \quad [1]$$

$$q1=½*\text{sqrt}(2)*x1+½*\text{sqrt}(2)*y1 \quad [2]$$

where:
x1 set-point coordinate in x direction,
y1 set-point coordinate in y direction,
p1 set-point coordinate in p direction,
q1 set-point coordinate in q direction.

The factors ½*sqrt(2) appearing in the above formulas [1] and [2] result from the assumption of $\alpha$ and $\beta$ each being 45°. It will be appreciated that for other angles of $\alpha$ and $\beta$ or other coordinate systems, other factors may result.

A first set-point generator 63 is configured to generate motion data, including motion coordinates, for moving the substrate table WT in the p direction, limiting the velocity in the p direction to a first maximum velocity. A second set-point generator 64 is configured to generate motion data, including motion coordinates, for moving the substrate table WT in the q direction, limiting the velocity in the q direction to a second maximum velocity. The first maximum velocity and the second maximum velocity may be selected to be the same or to be different. In the embodiment described here, the first maximum velocity and the second maximum velocity are selected to be the same, and to be substantially equal to [½*(sqrt(2) *maximum immersion velocity)] in the case of an immersion type lithographic apparatus.

A second coordinate transformer 65 receiving the motion data generated by the first and second set-point generators 63, 64 is configured to transform the motion coordinates of the p direction and the q direction determined by the first set-point generator 63 and the second set-point generator 64, respectively, into motion coordinates of the x direction and the y direction, respectively, for driving the first and second drive motors, respectively.

The second coordinate transformer 65 is configured to perform a transformation determined by the formulas [3] and [4]:

$$x2=½*\text{sqrt}(2)*p2-½*\text{sqrt}(2)*q2 \quad [3]$$

$$y2=½*\text{sqrt}(2)*p2+½*\text{sqrt}(2)*q2 \quad [4]$$

where:
x2 motion coordinate in x direction,
y2 motion coordinate in y direction,
p2 motion coordinate in p direction,
q2 motion coordinate in q direction.

As with the formulas [1] and [2], the factors ½*sqrt(2) appearing in the above formulas [3] and [4] result from the assumption of $\alpha$ and $\beta$ each being 45°. It will be obvious that for other angles of $\alpha$ and $\beta$ or other coordinate systems, other factors may result.

Figure 7:
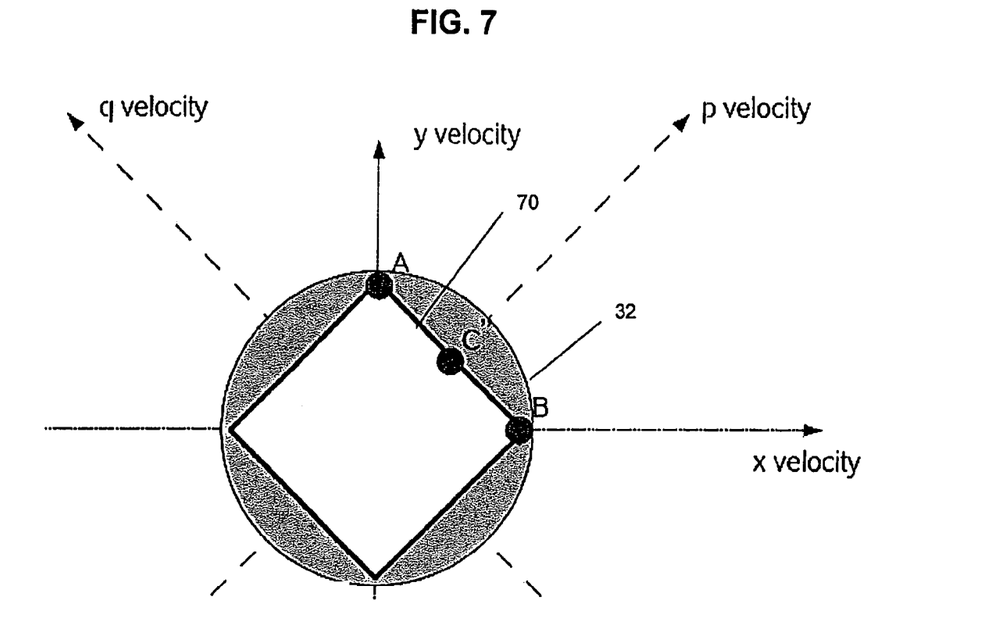
FIG. 7 illustrates a velocity vector diagram in x and y directions, and in p and q directions, according to an embodiment of a motion control system of the present invention.

A sum velocity vector field for the substrate support WT resulting from the above transformations is illustrated by the square 70 in FIG. 7. It appears from FIG. 7 that a scanning in an x direction and a scanning in a y direction may be performed at a maximum x velocity and maximum y velocity, respectively, and that with movements in other directions (an absolute value of) a maximum x velocity or maximum y velocity is not exceeded. In particular, if in an immersion type lithographic apparatus a maximum x velocity and a maximum y velocity have been set to be substantially equal to the maximum immersion velocity, then (the absolute value of) the maximum immersion velocity may not be exceeded using the transformations described above. As an example, point C" in FIG. 7 indicates a sum velocity vector obtained by the transformations and velocity limitations described above.

Figure 8:
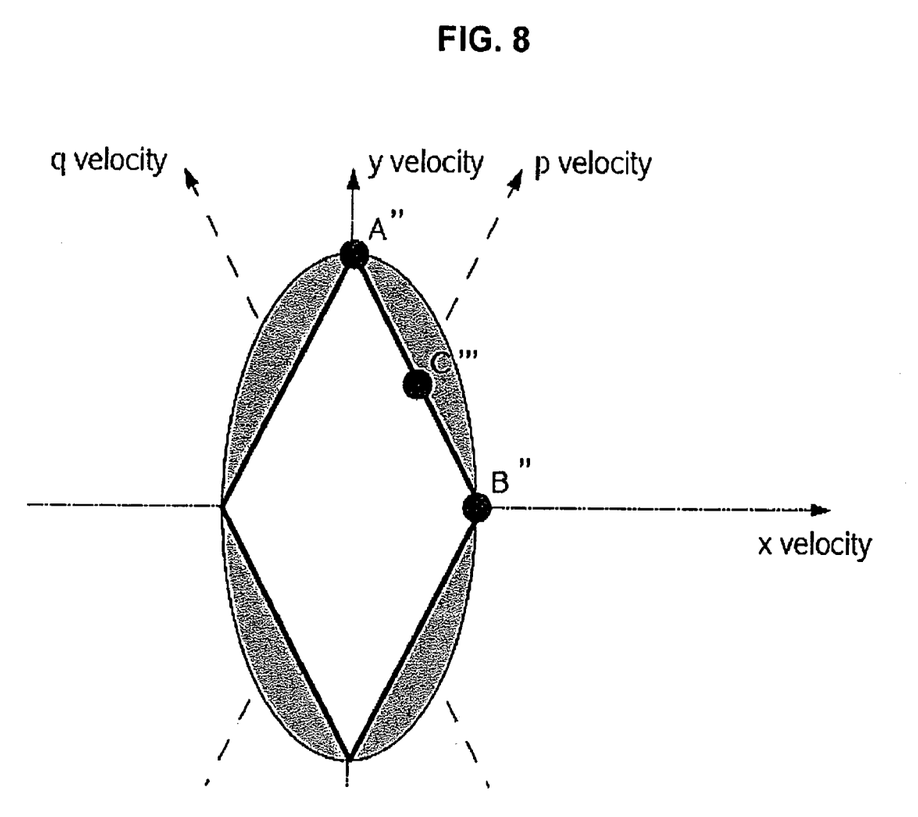
FIG. 8 illustrates a velocity vector diagram in x and y directions, and in p and q directions, according to a further embodiment of a motion control system of the present invention.

As FIG. 8 illustrates, other coordinate transformations using other angles of $\alpha$ and $\beta$ and different maximum x and y velocities B" and A", respectively, may easily be implemented in accordance with an embodiment of the present invention. According to FIG. 8, a maximum y velocity (in a scan direction) may be higher than a maximum x velocity (in a step direction). This may be in line with a specific design of an immersion cover or hood. Point C''' in FIG. 8 indicates a sum velocity vector obtained by the transformations and velocity limitations described above.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The terms "a" or "an", as used herein, are defined as one or more than one. The term plurality, as used herein, is defined as two or more than two. The term another, as used herein, is defined as at least a second or more. The terms including and/or having, as used herein, are defined as including (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

The descriptions above are intended to be illustrative, not limiting. Thus, it will be apparent to one skilled in the art that modifications may be made to the invention as described without departing from the scope of the claims set out below.

What is claimed is:

1. A lithographic apparatus, comprising:
a substrate support configured to hold a substrate;
a projection system configured to project a patterned radiation beam onto a target portion of the substrate; and
a drive system configured to move the substrate support along a trajectory relative to the projection system, the drive system comprising
a first drive motor configured to move the substrate support in a first direction;
a second drive motor configured to move the substrate support in a second direction;
a first trajectory planner configured to generate set-point data, including set-point coordinates, for the first drive motor to move the substrate in the first direction;
a second trajectory planner configured to generate set-point data, including set-point coordinates, for the second drive motor to move the substrate in the second direction;
a first coordinate transformer configured to transform the set-point coordinates of the first direction and the second direction determined by the first and second trajectory planner, respectively, into set-point coordinates of a third direction and a fourth direction;
a first set-point generator configured to generate motion data, including motion coordinates, for moving the substrate in the third direction, limiting the velocity in the third direction to a first maximum velocity;
a second set-point generator configured to generate motion data, including motion coordinates, for moving the substrate in the fourth direction, limiting the velocity in the fourth direction to a second maximum velocity; and
a second coordinate transformer configured to transform the motion coordinates of the third direction and the fourth direction determined by the first set-point generator and the second set-point generator, respectively, into motion coordinates of the first direction and the second direction, respectively, for driving the first and second drive motors, respectively.

2. The lithographic apparatus of claim 1, wherein the first coordinate transformer is configured to perform a transformation determined by:

$$p1 = \tfrac{1}{2}*\mathrm{sqrt}(2)*x1 + \tfrac{1}{2}*\mathrm{sqrt}(2)*y1$$

$$q1 = -\tfrac{1}{2}*\mathrm{sqrt}(2)*x1 + \tfrac{1}{2}*\mathrm{sqrt}(2)*y1$$

where:
x1 set-point coordinate in the first direction,
y1 set-point coordinate in the second direction,
p1 set-point coordinate in the third direction,
q1 set-point coordinate in the fourth direction.

3. The lithographic apparatus of claim 1, wherein the second coordinate transformer is configured to perform a transformation determined by:

$$x2 = \tfrac{1}{2}*\mathrm{sqrt}(2)*p2 - \tfrac{1}{2}*\mathrm{sqrt}(2)*q2$$

$$y2 = \tfrac{1}{2}*\mathrm{sqrt}(2)*p2 + \tfrac{1}{2}*\mathrm{sqrt}(2)*q2$$

where:
x2 motion coordinate in the first direction,
y2 motion coordinate in the second direction,
p2 motion coordinate in the third direction,
q2 motion coordinate in the fourth direction.

4. The lithographic apparatus of claim 1, wherein the first direction is substantially orthogonal to the second direction.

5. The lithographic apparatus of claim 1, wherein the third direction is substantially orthogonal to the fourth direction.

6. The lithographic apparatus of claim 1, wherein the third direction is at an angle $\alpha$ to the first direction, where $0<\alpha<90°$.

7. The lithographic apparatus of claim 6, wherein $\alpha=45°$.

8. The lithographic apparatus of claim 1, wherein the fourth direction is at an angle $\beta$ to the second direction, where $0<\beta<90°$.

9. The lithographic apparatus of claim 8, wherein $\beta=45°$.

10. The lithographic apparatus of claim 1, wherein a liquid is interposed between the projection system and the substrate.

11. A method for moving a substrate support relative to a projection system in a lithographic apparatus, the method comprising:
  providing a substrate support configured to hold a substrate;
  providing a projection system configured to project a patterned radiation beam onto a target portion of the substrate;
  providing a drive system configured to move the substrate support along a trajectory, the drive system comprising
    a drive motor configured to move the substrate support in a first direction, and
    a drive motor configured to move the substrate support in a second direction;
  generating set-point data, including set-point coordinates, for moving the substrate support relative to the projection system in the first direction;
  generating set-point data, including set-point coordinates, for moving the substrate support relative to the projection system in the second direction;
  transforming the set-point coordinates of the first direction and the second direction, respectively, into set-point coordinates of a third direction and a fourth direction;
  generating motion data, including motion coordinates, for moving the substrate support relative to the projection system in the third direction, limiting the velocity in the third direction to a first maximum velocity;
  generating motion data, including motion coordinates, for moving the substrate support relative to the projection system in the fourth direction, limiting the velocity in the fourth direction to a second maximum velocity; and
  transforming the motion coordinates of the third direction and the fourth direction, respectively, into motion coordinates of the first direction and the second direction, respectively, for driving the first and second drive motors, respectively.

12. The method of claim 11, wherein the transformation of the set-point coordinates is determined by:

$$p1=½*sqrt(2)*x1+½*sqrt(2)*y1$$

$$q1=-½*sqrt(2)*x1+½*sqrt(2)*y1$$

where:
  x1 set-point coordinate in the first direction,
  y1 set-point coordinate in the second direction,
  p1 set-point coordinate in the third direction,
  q1 set-point coordinate in the fourth direction.

13. The method of claim 11, wherein the transformation of the motion coordinates is determined by:

$$x2=½*sqrt(2)*p2-½*sqrt(2)*q2$$

$$y2=½*sqrt(2)*p2+½*sqrt(2)*q2$$

where:
  x2 motion coordinate in the first direction,
  y2 motion coordinate in the second direction,
  p2 motion coordinate in the third direction,
  q2 motion coordinate in the fourth direction.

14. A drive system comprising:
  a first drive motor configured to move a substrate support in a first direction; a second drive motor configured to move the substrate support in a second direction;
  a first trajectory planner configured to generate set-point data, including set-point coordinates, for the first drive motor to move the substrate in the first direction;
  a second trajectory planner configured to generate set-point data, including set-point coordinates, for the second drive motor to move the substrate in the second direction;
  a first coordinate transformer configured to transform the set-point coordinates of the first direction and the second direction determined by the first and second trajectory planner, respectively, into set-point coordinates of a third direction and a fourth direction;
  a first set-point generator configured to generate motion data, including motion coordinates, for moving the substrate in the third direction, limiting the velocity in the third direction to a first maximum velocity;
  a second set-point generator configured to generate motion data, including motion coordinates, for moving the substrate in the fourth direction, limiting the velocity in the fourth direction to a second maximum velocity; and
  a second coordinate transformer configured to transform the motion coordinates of the third direction and the fourth direction determined by the first set-point generator and the second set-point generator, respectively, into motion coordinates of the first direction and the second direction, respectively, for driving the first and second drive motors, respectively.

15. A device manufacturing method comprising:
  projecting a patterned beam of radiation onto a substrate;
  providing a substrate support configured to hold the substrate;
  providing a drive system configured to move the substrate support along a trajectory, the drive system comprising
    a drive motor configured to move the substrate support in a first direction, and
    a drive motor configured to move the substrate support in a second direction;
  generating set-point data, including set-point coordinates, for moving the substrate support relative to a projection system in the first direction;
  generating set-point data, including set-point coordinates, for moving the substrate support relative to the projection system in the second direction;
  transforming the set-point coordinates of the first direction and the second direction, respectively, into set-point coordinates of a third direction and a fourth direction;
  generating motion data, including motion coordinates, for moving the substrate support relative to the projection system in the third direction, limiting the velocity in the third direction to a first maximum velocity;
  generating motion data, including motion coordinates, for moving the substrate support relative to the projection system in the fourth direction, limiting the velocity in the fourth direction to a second maximum velocity; and
  transforming the motion coordinates of the third direction and the fourth direction, respectively, into motion coordinates of the first direction and the second direction, respectively, for driving the first and second drive motors, respectively.

16. A tangible computer-readable medium having stored thereon, computer-executable instructions that, if executed by a computing device, cause the computing device to perform a method for moving a substrate support relative to a projection system in a lithographic apparatus, the method comprising:

generating set-point data, including set-point coordinates, for moving the substrate support of the lithographic apparatus in a first direction;

generating set-point data, including set-point coordinates, for moving the substrate support in a second direction;

transforming the set-point coordinates of the first direction and the second direction, respectively, into set-point coordinates of a third direction and a fourth direction;

generating motion data, including motion coordinates, for moving the substrate support in the third direction, limiting the velocity in the third direction to a first maximum velocity;

generating motion data, including motion coordinates, for moving the substrate support in the fourth direction, limiting the velocity in the fourth direction to a second maximum velocity; and transforming the motion coordinates of the third direction and the fourth direction, respectively, into motion coordinates of the first direction and the second direction, respectively.

17. A device manufacturing method comprising:

projecting a patterned beam of radiation onto a substrate with a projection system, the substrate held by a substrate support; and moving the substrate support along a trajectory, the moving including generating set-point data, including set-point coordinates, for moving the substrate support relative to the projection system in a first direction;

generating set-point data, including set-point coordinates, for moving the substrate support relative to the projection system in a second direction;

transforming the set-point coordinates of the first direction and the second direction, respectively, into set-point coordinates of a third direction and a fourth direction;

generating motion data, including motion coordinates, for moving the substrate support relative to the projection system in the third direction, limiting the velocity in the third direction to a first maximum velocity;

generating motion data, including motion coordinates, for moving the substrate support relative to the projection system in the fourth direction, limiting the velocity in the fourth direction to a second maximum velocity; and transforming the motion coordinates of the third direction and the fourth direction, respectively, into motion coordinates of the first direction and the second direction, respectively, for moving the substrate support along the trajectory.

* * * * *